United States Patent
Desmaris et al.

(10) Patent No.: US 12,033,797 B2
(45) Date of Patent: Jul. 9, 2024

(54) DISCRETE METAL-INSULATOR-METAL (MIM) ENERGY STORAGE COMPONENT AND MANUFACTURING METHOD

(71) Applicant: Smoltek AB, Gothenburg (SE)

(72) Inventors: Vincent Desmaris, Gothenburg (SE); Rickard Andersson, Gothenburg (SE); Muhammad Amin Saleem, Gothenburg (SE); Maria Bylund, Gothenburg (SE); Anders Johansson, Öckerö (SE); Fredrik Liljeberg, Gothenburg (SE); Ola Tiverman, Västra Frölunda (SE); M Shafiqul Kabir, Västra Frölunda (SE)

(73) Assignee: SMOLTEK AB, Gothenburg (SE)

( * ) Notice: Subject to any disclaimer, the term of this patent is extended or adjusted under 35 U.S.C. 154(b) by 427 days.

(21) Appl. No.: 17/283,105

(22) PCT Filed: Oct. 7, 2019

(86) PCT No.: PCT/SE2019/050975
§ 371 (c)(1),
(2) Date: Apr. 6, 2021

(87) PCT Pub. No.: WO2020/080993
PCT Pub. Date: Apr. 23, 2020

(65) Prior Publication Data
US 2022/0013305 A1    Jan. 13, 2022

(30) Foreign Application Priority Data

Oct. 18, 2018 (SE) .................................. 1851284-8

(51) Int. Cl.
*H01G 11/36* (2013.01)
*H01G 11/56* (2013.01)
(Continued)

(52) U.S. Cl.
CPC ............ *H01G 11/36* (2013.01); *H01G 11/56* (2013.01); *H01M 10/0585* (2013.01);
(Continued)

(58) Field of Classification Search
CPC .................................................. H01G 11/36
(Continued)

(56) References Cited

U.S. PATENT DOCUMENTS

| 6,611,419 B1 | 8/2003 | Chakravorty |
| 8,203,823 B2 | 6/2012 | Oh |

(Continued)

FOREIGN PATENT DOCUMENTS

| CN | 101573772 | 11/2009 |
| CN | 102165542 | 8/2011 |

(Continued)

OTHER PUBLICATIONS

"Integrated on-chip solid state capacitor based on vertically aligned carbon nanofibers, grown using a CMOS temperature compatible process", by A. Saleem et al., Solid State Electronics, vol. 139, 75, (Jan. 2018), 5 pages.

(Continued)

*Primary Examiner* — Stanley Tso
(74) *Attorney, Agent, or Firm* — Westman, Champlin & Koehler, P.A.

(57) ABSTRACT

A discrete metal-insulator-metal (MIM) energy storage component, the energy storage component comprising: a MIM-arrangement comprising: a first electrode layer; a plurality of conductive nanostructures grown from the first electrode layer; a conduction controlling material covering each nanostructure in the plurality of conductive nanostructures and the first electrode layer uncovered by the conductive nanostructures; and a second electrode layer covering the conduction controlling material; a first connecting structure for (Continued)

external electrical connection of the capacitor component; a second connecting structure for external electrical connection of the capacitor component; and an electrically insulating encapsulation material at least partly embedding the MIM-arrangement.

31 Claims, 11 Drawing Sheets

(51) Int. Cl.
  *H01M 10/0585* (2010.01)
  *H01M 50/11* (2021.01)
  *H05K 1/18* (2006.01)
(52) U.S. Cl.
  CPC ............ *H01M 50/11* (2021.01); *H05K 1/181* (2013.01); *H05K 2201/10015* (2013.01); *H05K 2201/10037* (2013.01)
(58) Field of Classification Search
  USPC ........................................................ 361/782
  See application file for complete search history.

(56) References Cited

U.S. PATENT DOCUMENTS

| | | | |
|---|---|---|---|
| 8,546,937 B2 | 10/2013 | Machida et al. | |
| 8,817,452 B2 | 8/2014 | Nguyen et al. | |
| 8,907,449 B2 | 12/2014 | Takahashi et al. | |
| 9,548,289 B2 | 1/2017 | Lin et al. | |
| 9,595,514 B2 | 3/2017 | Bruno et al. | |
| 10,497,582 B2 | 12/2019 | Voiron et al. | |
| 10,541,363 B2 | 1/2020 | Cola et al. | |
| 10,985,313 B2 | 4/2021 | Cola et al. | |
| 2002/0195700 A1* | 12/2002 | Li | H01J 9/326 438/622 |
| 2003/0100189 A1* | 5/2003 | Lee | G11C 13/025 438/694 |
| 2004/0108587 A1 | 6/2004 | Chudzik et al. | |
| 2006/0221548 A1 | 10/2006 | Lee et al. | |
| 2009/0180239 A1 | 7/2009 | Oh | |
| 2011/0073990 A1* | 3/2011 | Berger | H01G 4/005 257/532 |
| 2011/0157770 A1 | 6/2011 | Nguyen et al. | |
| 2011/0193194 A1 | 8/2011 | Takahashi et al. | |
| 2011/0310530 A1* | 12/2011 | Laor | H05K 1/162 361/524 |
| 2014/0035892 A1* | 2/2014 | Shenoy | H01L 23/5389 345/205 |
| 2014/0146597 A1 | 5/2014 | Lee et al. | |
| 2014/0213032 A1* | 7/2014 | Kai | H10B 63/80 438/382 |
| 2015/0028450 A1 | 1/2015 | Park et al. | |
| 2015/0068001 A1 | 3/2015 | Nguyen et al. | |
| 2015/0131205 A1 | 5/2015 | Amaratunga et al. | |
| 2015/0250058 A1 | 9/2015 | Ramachandran | |
| 2015/0311461 A1 | 10/2015 | Cola et al. | |
| 2016/0049361 A1 | 2/2016 | Wang et al. | |
| 2016/0268144 A1 | 9/2016 | Voiron et al. | |
| 2016/0372449 A1 | 12/2016 | Rusu et al. | |
| 2017/0012029 A1 | 1/2017 | Lambert et al. | |
| 2017/0069601 A1 | 3/2017 | Park | |
| 2017/0141115 A1* | 5/2017 | Bower | H01L 28/40 |
| 2019/0096587 A1* | 3/2019 | Shin | H01G 4/1272 |
| 2020/0105653 A1* | 4/2020 | Elsherbini | H01L 24/02 |
| 2020/0227631 A1 | 7/2020 | Cola et al. | |

FOREIGN PATENT DOCUMENTS

| | | |
|---|---|---|
| CN | 104798208 | 7/2015 |
| CN | 106463489 | 2/2017 |
| EP | 2 074 641 B1 * | 1/2007 |
| EP | 2 074 641 | 2/2012 |
| JP | 2005-93749 | 4/2005 |
| JP | 2008-130778 | 6/2008 |
| JP | 2009-170861 | 7/2009 |
| JP | 2011-165794 | 8/2011 |
| JP | 2011-205020 | 10/2011 |
| JP | 2016-535441 | 11/2016 |
| JP | 2017-001938 | 1/2017 |
| JP | 2019-512871 | 5/2019 |
| WO | WO 2008/040706 | 4/2008 |
| WO | WO 2010/093761 | 8/2010 |
| WO | WO 2015/147881 | 10/2015 |
| WO | WO 2015/183762 | 12/2015 |
| WO | WO 2017/151040 | 9/2017 |

OTHER PUBLICATIONS

"Low-Cost and High-Productivity Three-Dimensional Nanocapacitors Based on Stand-Up ZnO Nanowires for Energy Storage", by L. Wei et al., Nanoscale Research Letters, vol. 11, 213 (2016), 9 pages.
"Atomic Layer Deposition of Functional Layers for on Chip 3D Li-Ion All Solid state Microbattery", by M. Letiche et la., Advanced Energy Materials, vol. 7, (2017), 12 pages.
International Search Report and Written Opinion from PCT/SE2019/050975, dated Nov. 18, 2019.
Office Action from Chinese Application No. 201980066444.6, dated Feb. 7, 2022.
Office Action from Chinese Patent Application No. 201980076284.3, dated Apr. 24, 2022.
Extended European Search Report from European Patent Application No. 19889962.7, dated Jul. 19, 2022.
International Search Report and Written Opinion from International Application No. PCT/SE2019/051176, dated Dec. 16, 2019.
Extended Search Report from European Patent Application No. 19873275.2, dated Jun. 15, 2022.
Office Action from Japanese Patent Application No. 2021-520229, dated Sep. 12, 2023.

* cited by examiner

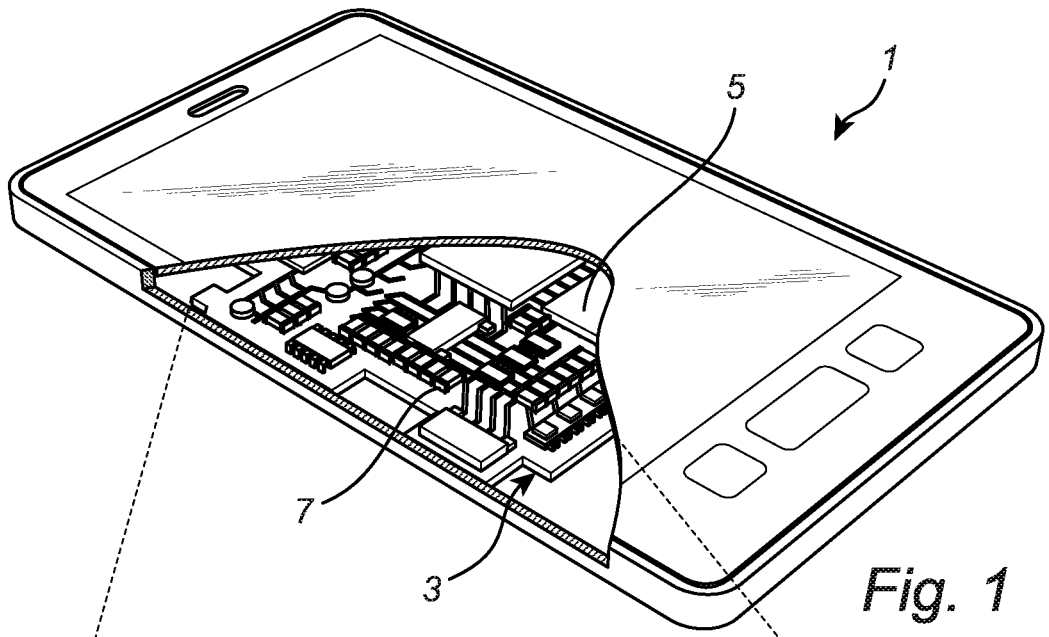
Fig. 1
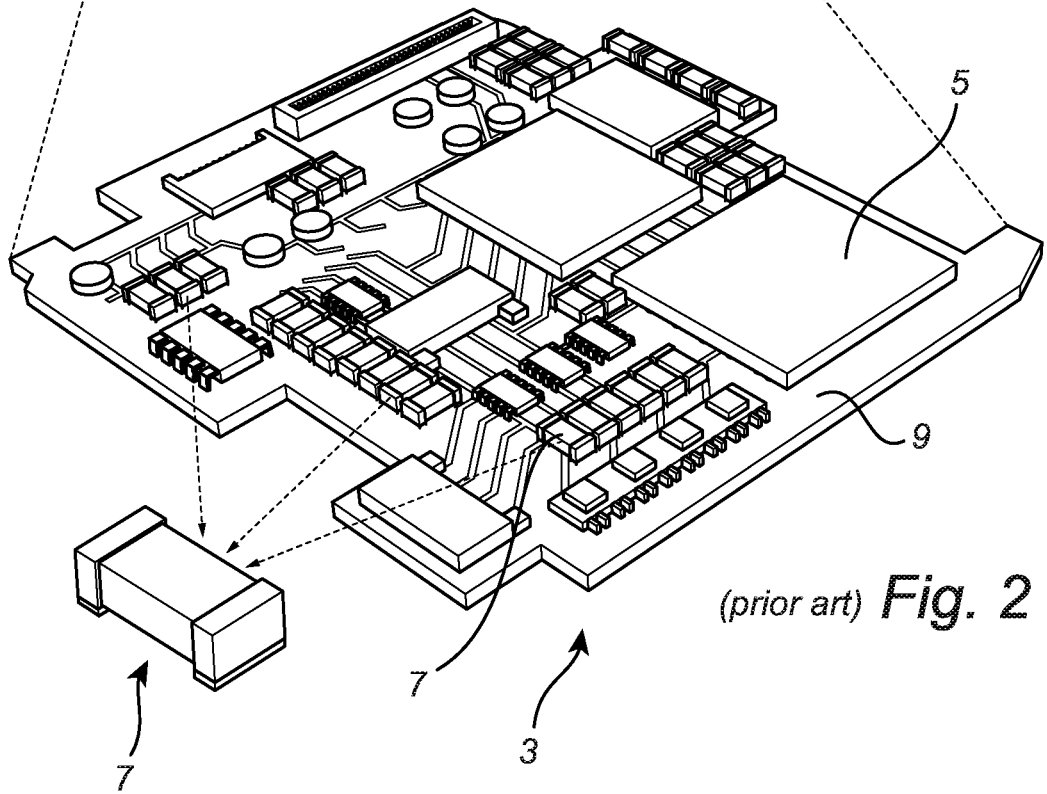
(prior art) Fig. 2

DISCRETE METAL-INSULATOR-METAL (MIM) ENERGY STORAGE COMPONENT AND MANUFACTURING METHOD

CROSS-REFERENCE TO RELATED APPLICATION

This Application is a Section 371 National Stage Application of International Application No. PCT/SE2019/050975, filed Oct. 7, 2019 and published as WO 2020/080993 on Apr. 23, 2020, in English, which claims priority to Swedish Application No. 1851284-8, dated Oct. 18, 2018, the contents of which are hereby incorporated by reference in their entirety.

FIELD OF THE INVENTION

The present invention relates to discrete metal-insulator-metal (MIM) electrostatic and/or electrochemical energy storage components, including capacitors and batteries, and to a method of manufacturing such discrete metal-insulator-metal (MIM) energy storage components.

BACKGROUND OF THE INVENTION

Miniaturization of electronics has been the trend for many decades which has enabled us to witness different kinds of gadgets with many functionalities. To a large part, this progress was enabled by miniaturizing and integrating transistors, resistors and capacitors for logic applications onto silicon. By comparison, passive components (resistors, capacitors, and inductors) at the circuit-board level have made only incremental advances in size and density. As a consequence, passive components occupy an increasingly larger area and mass fraction of electronic systems and are a major hurdle for further miniaturization of many electronic systems with lower system cost. Current smartphones typically use more than 1000 discrete capacitor components. A circuit board of an electric car utilizes roughly 10000 such discrete capacitor components and trend is upwards. The need for such large numbers of capacitors is primarily driven by the need to tackle the problem with power management systems driving the power all the way from the source of energy (battery/mains power) through the packaging schemes (PCB/SLP/SoC/SiP) to the functional silicon chip/die, and to the on chip integrated circuits. There are different power management problems to tackle at different stages of integrations of such gadgets.

Miniaturization of silicon circuits has enabled us to achieve more functions per unit area. Such achievements have come with a price and have stressed the power management system of the die to the extreme. Today's silicon chips suffer heavily from power noise induced by leakage current from the transistors, high frequency reflections in the interconnect grids, parasitics switching noise etc. along the power grid. Such power noise can cause voltage fluctuation and impedance mismatch of the circuit and may result in gate delay and logic errors, jitter, etc. and can be catastrophic. It is a vast area of research on how to tackle such on-chip power management solutions. One of the ways to tackle such problem is to use metal insulator metal (MIM) decoupling capacitors integrated with the circuit. However, such integrated schemes to tackle the problems inside of a die is limited by white space (expensive real estate space available on die) to integrate decoupling capacitors on the surface of the die. It is reported that the white space decreasing and that only about 10% is allocated in today's generation per die, for on chip decoupling capacitors.

Therefore, there is a need for increasing the capacitance density of such decoupling capacitors within the stipulated 2D area. Some solutions are proposed and demonstrated in A. M. Saleem et al., 'Integrated on-chip solid state capacitor based on vertically aligned carbon nanofibers, grown using a CMOS temperature compatible process', Solid State Electronics, vol. 139, 75 (January 2018), and in EP2074641. The prior arts have shown improvements of the capacitive values with respect to traditional MIM capacitors. The demonstrated devices are, however, prone to suffer from the parasitic capacitances from the field oxide present on the contact points, or from the nanostructure growing randomly outside of the device area causing unintentional and uncontrolled parasitic effects (capacitive/resistive/inductive) to be present in the device which will cause detrimental effects for circuit implementation. A lot of design and processing improvement steps are anticipated to be needed (for example CMP planarization processing, field oxide removal etc.) to make such device free of parasitics which essentially diminishes the benefits of such technology concepts for practical implementations.

Looking from another angle of view—the PCB/SLP board level—the power supply rails (e.g., ±2.5V, ±12V or 3.3V etc) providing the power in most cases are produced by linear power supply or switch mode power supply techniques. Despite that they both have rectification and filtering or regulation stage prior to feeding to the power grid of the electronic circuits, they still may possess ripple noise. Hence a lot of capacitors are typically found on the board, and the quantity and value of capacitors become higher as the switching frequency of the IC rises. Moreover, the power supply requirements and noise margins are becoming more and more stringent as the power supply requirements of ICs are progressing towards lower operating voltages. Additionally, with advancement in the system level packaging like SoC/SiP, FOWLP/FIWLP/Chiplet wafer level packaging of dissimilar ICs/heterogeneous integrations, power management is becoming a dominant issue. Noise may occur in the voltage levels either due to poor power supply regulation, length/shape of PCB power interconnects, wire parasitics, switching frequencies of ICs and EMI effects etc. For such complex integrated packages, capacitors closer to the different ICs are required for better performances.

Today's industry standard MLCC/TSC/LICC capacitor technologies to manufacture such discrete components are challenged to comply with the increasing demand for lower height (Z height) to be sub 100 μm and preferably below 20 μm. This demand is due to the fact that the ICs that are integrated in packaging SoC/SiP packaging require sub 70 μm height of the capacitor to accommodate between the SoC/SiP packaging solutions due to decrease in the bumps interconnects heights and pitch/spacing.

To circumvent this issue, US20170012029 demonstrates embodiments to accommodate a MIM capacitor configuration at the back side of a die. Such a scheme, however, needs to be CMOS compatible and must be done on every die that is to be assembled. This may entail the limitations of such technology concepts due to adaptation complexities of such MIM structure in different technology nodes and costs associated with such implementation. This may essentially increase the cost per die substantially and may slay the cost benefits per function that is needed at a packaging level.

MLCC is the most prominent type of discrete capacitor component used in the world. Trillions of such discrete components are used every year in any given system/gadget.

There has been some progress in miniaturizing of these components and the thinnest that can be found commercially is claimed by Taiyo Yuden to be 110 µm. Samsung Electro-Mechanical system have introduced the concept of LICC to reduce the thickness and reach lower ESL (Effective Series Inductance) even further. Ipdia (now part of Murata) has introduced TSC discrete capacitor component to be as thin as 80 µm with a staggering capacitance value exceeding 900 nF/mm2. However, MLCC, LICC and TSC are prone to struggle to going down in Z dimension (height) further due to materials involved (raw metal/dielectric particles), processing schemes (sintering/silicon etching) and cost of raw materials and processing. ((MLCC process requires a thorough understanding of the limitations of the raw materials used in capacitor manufacturing, including copper, nickel, silver, gold, tantalum, barium titanate, alumina etc. It is also known that the ceramic class 2 MLCC suffers negatively under temperature variations, applied voltage and over time (aging) results in significant degradation of capacitance values from the originally stipulated capacitance values by the vendors. Such degradation can affect adversely any sub-system related to security of a system (e.g. electric car).

Further miniaturization of these components based on those established technologies thus may not be as cost competitive as it was before. It is particularly challenging to match with the need to be small enough both in 2D and in 3D space such that the discrete capacitor components can fit between the flip chip bumps interconnects without compromising the cost.

Discrete capacitor components need to be produced in trillions to fulfil the industrial demand and CMOS compatible technologies are simply cost prohibitive to be exploited for producing discrete components with respect to MLCC or LICC or TSC.

SUMMARY

It is therefore evident that there is a large gap between the integrated capacitor and discrete capacitor components products that need innovative solutions. The same applies to other types of energy storage components.

According to a first aspect of the present invention, it is therefore provided a discrete metal-insulator-metal (MIM) energy storage component, said energy storage component comprising: a MIM-arrangement comprising: a first electrode layer; a plurality of conductive nanostructures grown from said first electrode layer; a conduction controlling material covering each nanostructure in said plurality of conductive nanostructures and said first electrode layer left uncovered by said conductive nanostructures; and a second electrode layer covering said conduction controlling material; a first connecting structure for external electrical connection of said energy storage component; a second connecting structure for external electrical connection of said energy storage component; and an electrically insulating encapsulation material at least partly embedding said MIM-arrangement.

According to embodiments, the energy storage component can facilitate to store electrostatic or electrochemical energy or the combination of them.

According to embodiments, the conduction controlling material may be a solid dielectric, and the MIM energy storage component may be a nanostructure capacitor component.

According to other embodiments, the conduction controlling material may be an electrolyte, and the MIM energy storage component may be a nanostructure battery component.

Advantageously, the nanostructures may be "non-horizontally" grown, such as generally vertically grown. The nanostructures may be generally straight, spiraling, branched, wavy or tilted.

In the context of the present application, the term "conformally coating" should be understood to mean depositing on a surface a layer of material in such a way that the thickness of the layer of material becomes the same regardless of the orientation of the surface. Various deposition method for achieving such so-called conformal layers or films are well-known to those skilled in the art. Notable examples of deposition methods that may be suitable are various vapor deposition methods, such as CVD, ALD, and PVD.

By "solid dielectric material" should be understood a dielectric material that is in a solid state in room temperature. Accordingly, this wording excludes any materials that are liquids in room temperature.

By "solid electrolyte material" should be understood a electrolyte material that is in a solid state or sol-gel state in room temperature.

The solid dielectric material may advantageously be a so-called high-k dielectric. Examples of high k-dielectric materials include, e.g. HfOx, TiOx, TaOx and other well-known high k dielectrics. Alternatively, the dielectric can be polymer based e.g. polypropylene, polystyrene, poly(p-xylene), parylene etc. Other well-known dielectric materials, such as $Al_2O_x$, SiOx or SiNx, etc may also be used. The present invention contemplates to use at least one dielectric material layer where needed. More than one dielectric materials or multiple layers of dissimilar dielectric layers are also envisaged to control the effective dielectric properties or electric field properties.

In a nanostructure electrochemical storage or battery, the conduction controlling material involves primarily ions as part of the energy storage mechanism present in the conduction controlling material, such as by providing for energy storage by allowing transport of ions through the conduction controlling material. Suitable electrolytes may be solid or semi-solid electrolytes, and may be chosen forms of solid crystals, ceramic, garnet or polymers or gel to act as electrolyte e.g. strontium titanate, yttria-stabilized zirconia, PMMA, KOH, lithium phosphorus oxynitride, Li based composites etc. The electrolyte layer may include a polymer electrolyte. The polymer electrolyte may include a polymer matrix, an additive, and a salt.

The conduction controlling electrolyte materials may be deposited via CVD, thermal processes, or spin coating or spray coating or any other suitable method used in the industry.

According to embodiments of the invention, the conduction controlling material may comprise a solid dielectric and an electrolyte in a layered configuration. In such embodiments, the MIM energy storage component may be seen as a hybrid between a capacitor-type (electrostatic) and a battery-type (electrochemical) energy storage device. This configuration may provide for a higher energy density and power density than a pure capacitor component and faster charging than pure battery component.

The present invention contemplates to use any substrate for example, Si, glass, SiC, stainless steel, metal foil e.g.

Al/Cu/Ag etc. foil or any other suitable substrate used in the industry. The substrate can present a substantially flat surface or can be non flat.

One or both the first electrode layer and the second electrode layer may advantageously be uniform and uninterrupted layers, substantially without internal patterns or holes etc. In another aspect, one or both of the electrodes may be patterned to accommodate any specific desired design of the capacitor electrodes for example in circular pattern or if the capacitor is to be made around a via.

The present invention contemplates to use any metal or metal alloy or doped silicon or metal oxide e.g. LiCoO2 etc. as per design and performance need of the energy storage component. For example, metal layer may include a transition metal oxide, a composite oxide of lithium and a transition metal, or a mixture thereof. The transition metal oxide may include lithium cobalt oxide, lithium manganese oxide, or vanadium oxide. Metal contact layer may include one selected from the group consisting of Li, silicon tin oxynitride, Cu, and a combination thereof.

The present invention also contemplates the substrate to be used as or included in the first electrode layer. The present invention is based upon the realization that a cost-efficient and extremely compact, in particular thin, discrete metal-insulator-metal (MIM) energy storage component can be realized using a MIM-arrangement comprising a plurality of vertically grown conductive nanostructures. Through embodiments of the present invention, passive energy storage components with profile height below 100 μm can be achieved, and they can be a competitive alternative to currently existing MLCC/TSC components. The reduced component height may allow more efficient utilization of the available space on a circuit board. For instance, the very thin discrete MIM capacitor or battery components according to embodiments of the present invention could be arranged on the bottom side of an integrated circuit (IC)-package, which provides for a more compact circuit layout, as well as a shorter conductor distance between IC and capacitors. At least the latter of these provides for reduced parasitic capacitances and inductances, which in turn provides for improved performance of the IC.

The present invention however do not exclude the possibilities to manufacture thicker than 100 μm profile height which maybe suitable to be used in other industrial applications where the profile height is not constrained.

Embodiments of the present invention can fulfil the requirement of (a) very high electrostatic or electrochemical capacitance value per unit area/volume, (b) low profile in 2D and Z direction, (c) surface mount compatible and suitable for 2D, 2.5D and 3D packaging/assembly/embedded technologies, (d) easy to design form factor, (e) Stable and robust performance against temperature and applied voltages (f) low equivalent series inductance (ESL) per square, (g) longer life time or enhanced life cycle without capacitive degradation and (h) cost effective.

According to various embodiments of the present invention, the second electrode layer may completely fill a space between adjacent nanostructures in the plurality of conductive nanostructures, at least halfway between a base and a tip of the nanostructures, from the base towards the tip. This configuration increases the robustness and reliability of the MIM-arrangement comprised in the energy storage component, which in turn provides for a more robust and reliable energy storage component. In particular, the mechanical stability of the nanostructures in the MIM-arrangement can be increased. Furthermore, the potential occurrence of voids between nanostructures can be decreased, which may be beneficial for the reliability of the energy storage components, especially in respect of temperature cycling etc.

In embodiments, the second electrode layer may completely fill the space between adjacent nanostructures in the plurality of conductive nanostructures, all the way between the base and the tip of the nanostructures, which may improve the robustness and reliability of the energy storage component even further.

According to various embodiments, the second electrode layer may advantageously comprise a first sub-layer conformally coating the solid dielectric material layer; and a second sub-layer formed on the first sub-layer.

In these embodiments, the second electrode layer may be formed using different deposition techniques. The first sub-layer may be deposited using a deposition technique suitable for conformal coatings, such as atomic layer deposition (ALD), and the second sub-layer may be deposited using a relatively cheap and fast deposition technique ensuring bottom to top deposition, such as electroplating or electroless plating. Accordingly, this configuration may provide for a favorable trade-off between performance and cost.

Advantageously, the second electrode layer may additionally comprise a third sub-layer between the first sub-layer and the second sub-layer, the third sub-layer conformally coating the first sub-layer. In this configuration, the first sub-layer may be a so-called adhesion layer, the third sub-layer may be a seed-layer for electroplating, and the second sub-layer may be an electroplated layer Moreover, additional sub layer(s) for example as metal diffusion barrier may conveniently be deposited in accordance with the present invention disclosure. The present invention also contemplates to use the first sub layer maybe used as both metal diffusion barrier as well as adhesion layer.

The present invention also contemplates to use different materials or material compositions in the first and second electrode layers.

The use of grown nanostructures allows extensive tailoring of the properties of the nanostructures. For instance, the growth conditions may be selected to achieve a morphology giving a large surface area of each nanostructure, increasing the charge carrying capacity of the nanostructures, which in turn provides for an increased capacitance of capacitor component embodiments, and an increased energy density of battery component embodiments.

The conductive nanostructures may advantageously be carbon nanofibers (CNF). Alternatively, the conductive nanostructures may be carbon nanotubes (CNT) or carbide-derived carbon nanostructures or graphene walls. In embodiment, moreover, the nanostructures may be nanowires such as copper, aluminum, silver, silicide or other types of nanowires with conductive properties.

The use of CNF may, however, be particularly advantageous for discrete energy storage components according to embodiments of the present invention. CNTs are known to be capable of providing a higher conductivity than CNFs. However, processes to form conductive CNTs also tend to result in the formation of a proportion of semiconducting CNTs, and this proportion may not be known or precisely controllable. CNFs, on the other hand, are metallic, which provides for improved reproducibility. Furthermore, the surface area of a CNF can be made considerably larger than the surface area of a CNT with the same overall dimensions (diameter and height), which provides for more charge accumulation sites, and thereby a higher charge carrying capability, in turn resulting in a higher capacitance for the same number and overall dimensions of nanostructures in the MIM-arrangement.

In embodiments, the carbon nanofibers may be at least partly formed by amorphous carbon. This results in a higher number of carbon atoms per surface area, resulting in more charge accumulation sites, which in turn results in a higher capacitance for the same number and overall dimensions of nanostructures in the MIM-arrangement.

In embodiments, the carbon nano fibers may be branched carbon nanofibers. This may result in a further increase of the accessible surface area, resulting in more charge accumulation sites, which in turn results in a higher capacitance for the same number and overall dimensions of nanostructures in the MIM-arrangement.

According to embodiments, furthermore, each CNF in the plurality of CNFs may have a corrugated surface structure, which also increases the number of charge accumulation sites (per CNF).

To fully benefit from the use of CNFs with corrugated surface structures or branched nanofibers structures, it may be particularly advantageous to deposit the solid dielectric material as a very thin conformal film, capable of reproducing the extremely fine corrugation or branched nanostructures of the CNFs.

Moreover, the discrete MIM energy storage component according to embodiments of the first aspect of the present invention may advantageously be included in an electronic device, further comprising a printed circuit board (PCB); and an integrated circuit (IC) on the PCB. The discrete MIM energy storage component may be connected to the IC via a conductor pattern on the PCB. Alternatively, the discrete MIM energy storage component may be connected to the IC-package. The circuit board need not necessarily be a conventional PCB, but may be a flexible printed circuit (FPC) or an SLP (substrate-like PCB).

Such a CNF MIM energy storage based component may conveniently be referred to as a CNF-MIM energy storage component.

According to a second aspect of the invention, it is provided a discrete metal-insulator-metal (MIM) energy storage component, the energy storage component comprising: at least a first and a second MIM-arrangement, each comprising: a first electrode layer; a plurality of conductive nanostructures grown from the first electrode layer; a conduction controlling material covering each nanostructure in the plurality of conductive nanostructures and the first electrode layer uncovered by the conductive nanostructures; and a second electrode layer covering the conduction controlling material; a first connecting structure for external electrical connection of the energy storage component, the first connecting structure being electrically conductively connected to the first electrode layer of the first MIM-arrangement; a second connecting structure for external electrical connection of the energy storage component, the second connecting structure being electrically conductively connected to the second electrode layer of the first MIM-arrangement; a third connecting structure for external electrical connection of the energy storage component, the third connecting structure being electrically conductively connected to the first electrode layer of the second MIM-arrangement; a fourth connecting structure for external electrical connection of the energy storage component, the fourth connecting structure being electrically conductively connected to the second electrode layer of the second MIM-arrangement; and an electrically insulating encapsulation material at least partly embedding the at least first and second MIM-arrangements.

Further embodiments of, and effects obtained through this second aspect of the present invention are largely analogous to those described above for the first aspect of the invention.

According to a third aspect of the present invention, it is provided a method of manufacturing a discrete metal-insulator-metal (MIM) energy storage component, comprising the steps of: providing a substrate; forming a MIM-arrangement on the substrate; forming a first connecting structure for external electrical connection of the energy storage component; forming a second connecting structure for external electrical connection of the energy storage component; and at least partly embedding the MIM-arrangement in a dielectric encapsulation material.

In embodiments, the method may further comprise the step of removing the substrate after the step of forming the MIM-arrangement.

In embodiments, the substrate may constitute or be included in the first electrode layer. In such embodiments, the substrate would not be removed after forming the MIM-arrangement.

Further embodiments of, and effects obtained through this third aspect of the present invention are largely analogous to those described above for the first and second aspects of the invention.

BRIEF DESCRIPTION OF THE DRAWINGS

These and other aspects of the present invention will now be described in more detail, with reference to the appended drawings showing an example embodiment of the invention, wherein:

FIG. 1 schematically illustrates an application for discrete MIM-energy storage components according to embodiments of the present invention, in the form of a schematic mobile phone;

FIG. 2 schematically illustrates an example of a circuit board according to the prior art, which may represent a typical circuit board in a current electronic device;

DETAILED DESCRIPTION OF EXAMPLE EMBODIMENTS

FIG. 1 schematically illustrates an electronic device according to an embodiment of the present invention, here in the form of a mobile phone 1. In the simplified and schematic illustration in FIG. 1, it is indicated that the mobile phone, like most electronic devices, comprises a circuit board 3, populated with packaged integrated circuits 5, and passive components, including energy storage components, here in the form of capacitors 7.

In FIG. 2, which is an exemplary illustration of a circuit board 3 using technology that is currently available for rational and cost-efficient mass-production, there are a large number of capacitors 7 mounted on a printed circuit board (PCB) 9. The capacitors 7 presently used are often so-called multilayer ceramic capacitors (MLCCs), with a minimum package height of about 0.4 mm.

To provide for even more compact electronic devices, with even higher processing speeds, it would be desirable to reduce the space occupied by the capacitors 7 needed for decoupling and temporary energy storage, and to reduce the distance between an IC 5 and the capacitors 7 serving that IC 5.

This can be achieved using discrete MIM-energy storage components according to embodiments of the present invention, in this case MIM-capacitor components, since such MIM-capacitor components can be made with a considerably smaller package height than conventional MLCCs with the same capacitance and footprint.

Figure 3:
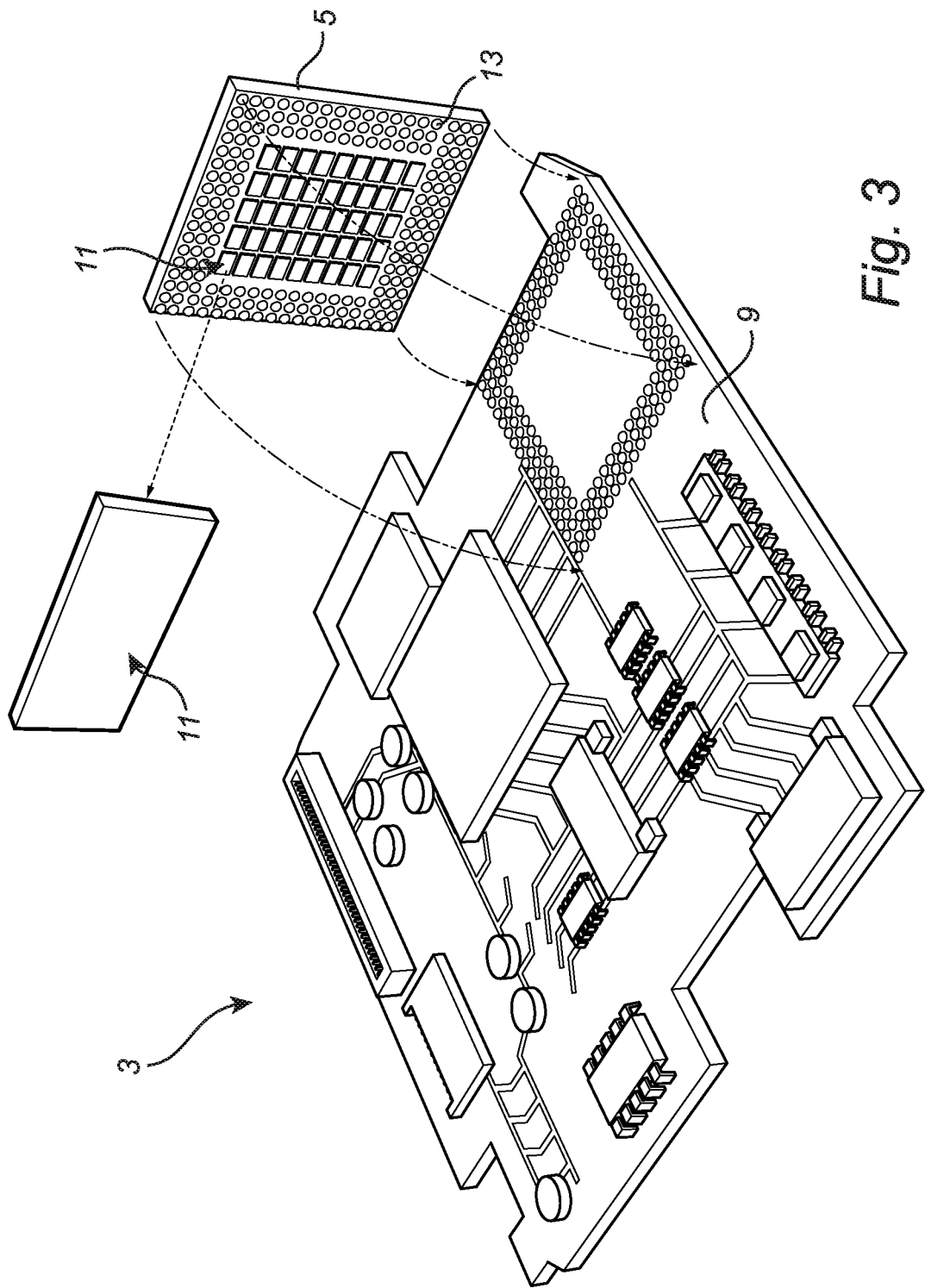
FIG. 3 schematically illustrates possible implications of replacing the conventional energy storage components on the circuit board in FIG. 2 with energy storage components according to an example embodiment of the present invention.

FIG. 3 is a schematic illustration of possible implications of replacing the conventional capacitor components on the circuit board in FIG. 2 with MIM-capacitor components according to an example embodiment of the present invention. As is evident from FIG. 3, the decreased package height of MIM-capacitor components 11 according to embodiments of the present invention allows placement of the capacitors 11 under the IC-package 5, between the connecting balls 13 of the IC-package 5. Obviously, this arrangement of the capacitors 11 allows for a smaller PCB 9, and thus for a more compact electronic device 1. Shorter distances between active circuitry in the IC 5 and the capacitors 11 are clearly also provided for.

Figure 4:
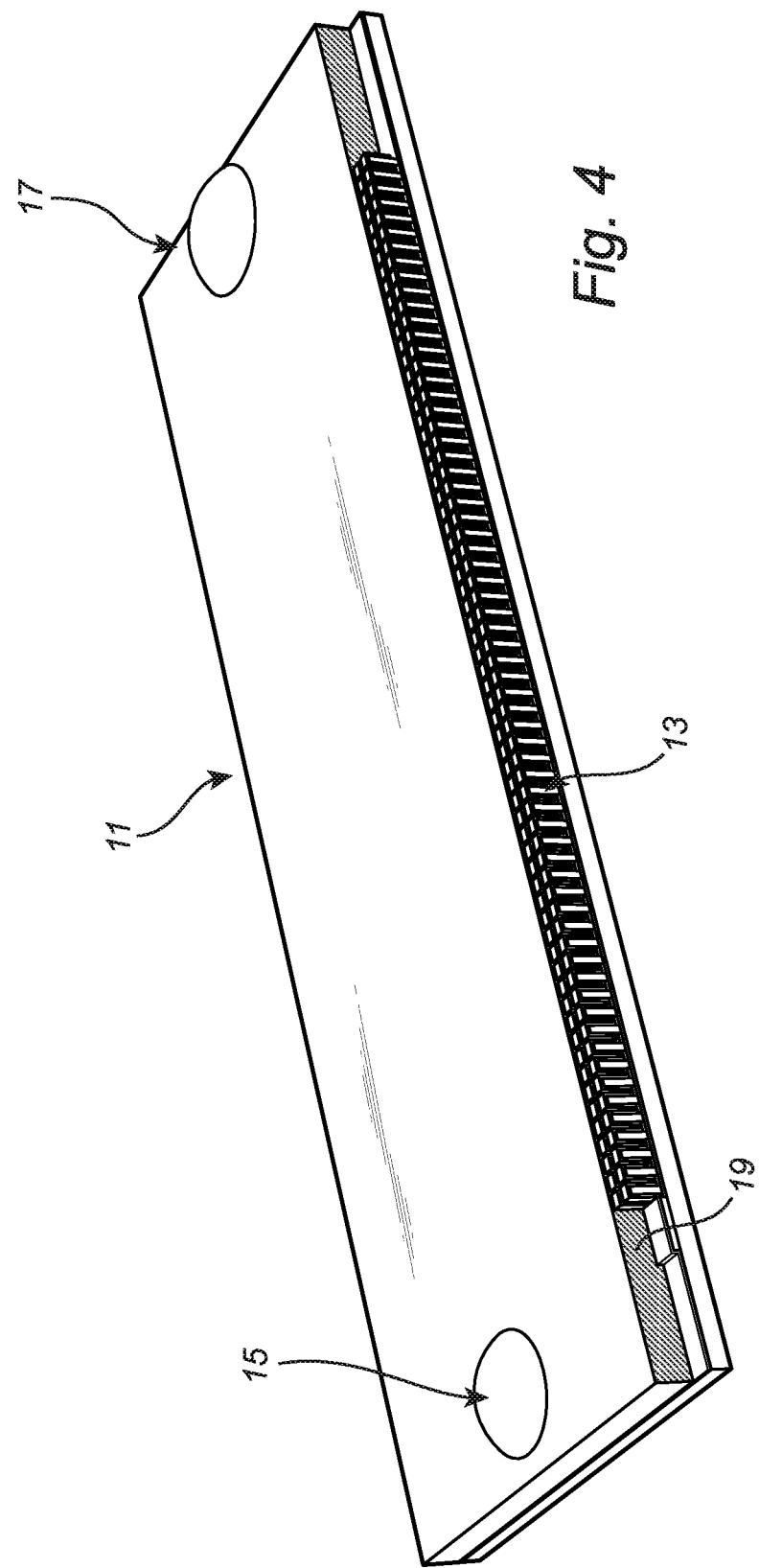
FIG. 4 is a schematic illustration of a MIM-energy storage component according to a first example embodiment of the present invention.

FIG. 4 is a schematic illustration of a MIM-energy storage component 11 according to a first example embodiment of the present invention. This MIM-energy storage component is a discrete MIM energy storage component, comprising a MIM-arrangement 13, a first connecting structure, here in the form of a first bump 15, a second connecting structure, here in the form of a second bump 17, and a dielectric encapsulation material 19, at least partly embedding the MIM-arrangement 13. As can be seen in FIG. 4, the electrically insulating encapsulation material 19 at least partly forms an outer boundary surface of the energy storage component. The first 15 and second 17 connecting structures also at least partly forms the outer boundary surface of the energy storage component.

Figure 5A:
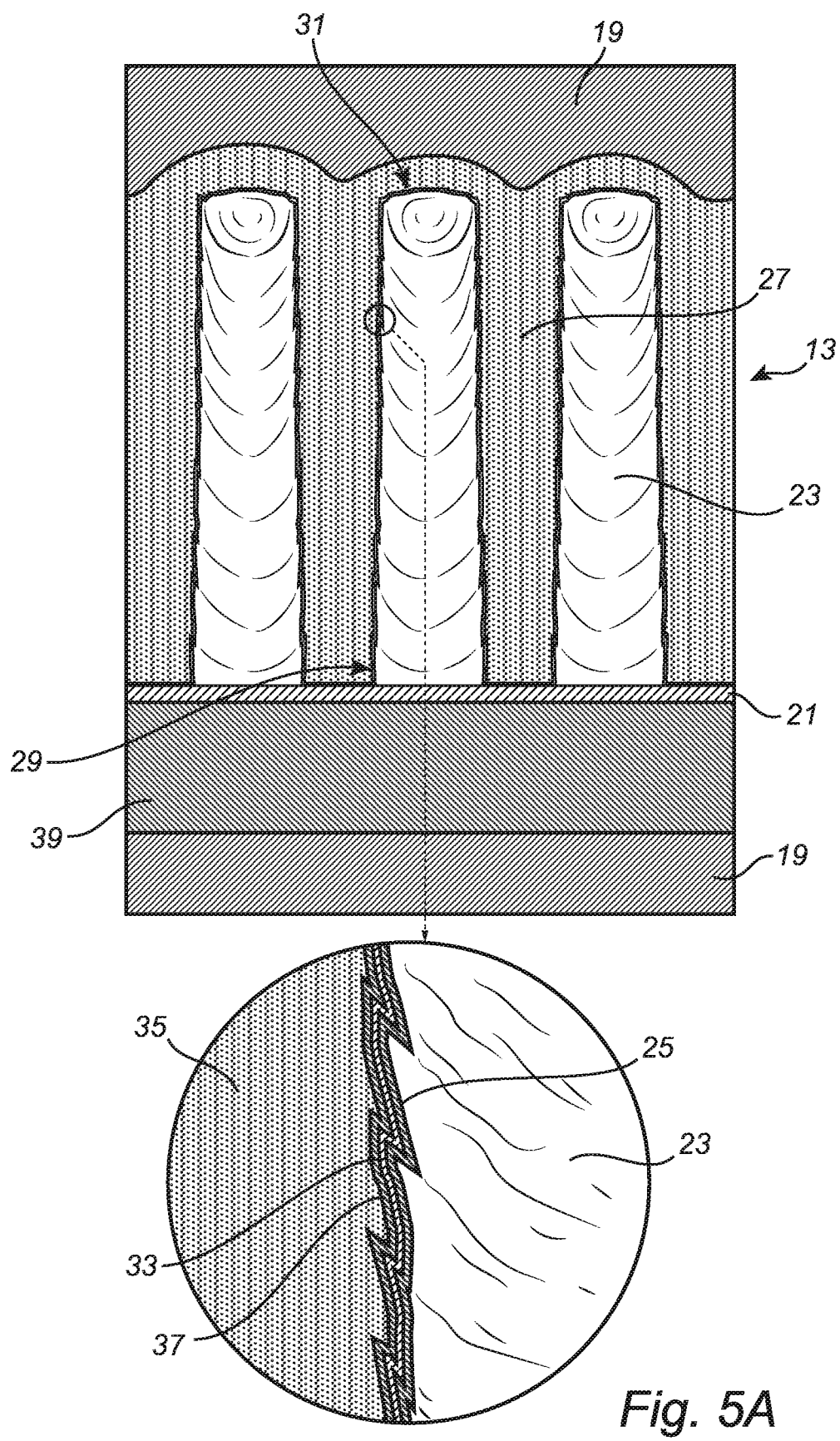
FIG. 5A is an enlarged illustration of a first example MIM-arrangement for a MIM-capacitor component.

A first example configuration of the MIM-arrangement 13 will now be described with reference to FIG. 5A. A MIM-energy storage component comprising the MIM-arrangement 13 in FIG. 5A is a MIM-capacitor component. As is schematically shown in FIG. 5A, the MIM-arrangement 13 comprises a first electrode layer 21, a plurality of conductive nanostructures 23 vertically grown from the first electrode layer 21, a solid dielectric material layer 25 conformally coating each nanostructure 23 in the plurality of conductive nanostructures and the first electrode layer 21 not covered by the conductive nanostructures 23, and a second electrode layer 27 covering the solid dielectric material layer 25. As can be seen in FIG. 5A, the second electrode layer 27 completely fills a space between adjacent nanostructures more than halfway between a base 29 and a top 31 of the nanostructures 23. In the exemplary MIM-arrangement 13 in FIG. 5A, the second electrode layer 27 completely fills the space between adjacent nanostructures 23, all the way from the base 29 to the top 31, and beyond.

As can be seen in the enlarged view of the boundary between nanostructure 23 and second electrode layer 27 in FIG. 5A, the second electrode layer 27 comprises a first sublayer 33 conformally coating the solid dielectric material layer 25, a second sublayer 35, and a third sublayer 37 between the first sublayer 33 and the second sublayer 35.

Moreover, additional sub layer(s) for example as metal diffusion barrier not shown in the figure may conveniently be present in accordance with the present invention disclosure.

The dielectric material layer 25 may be a multi-layer structure, which may include sub-layers of different material compositions.

Figure 5B:
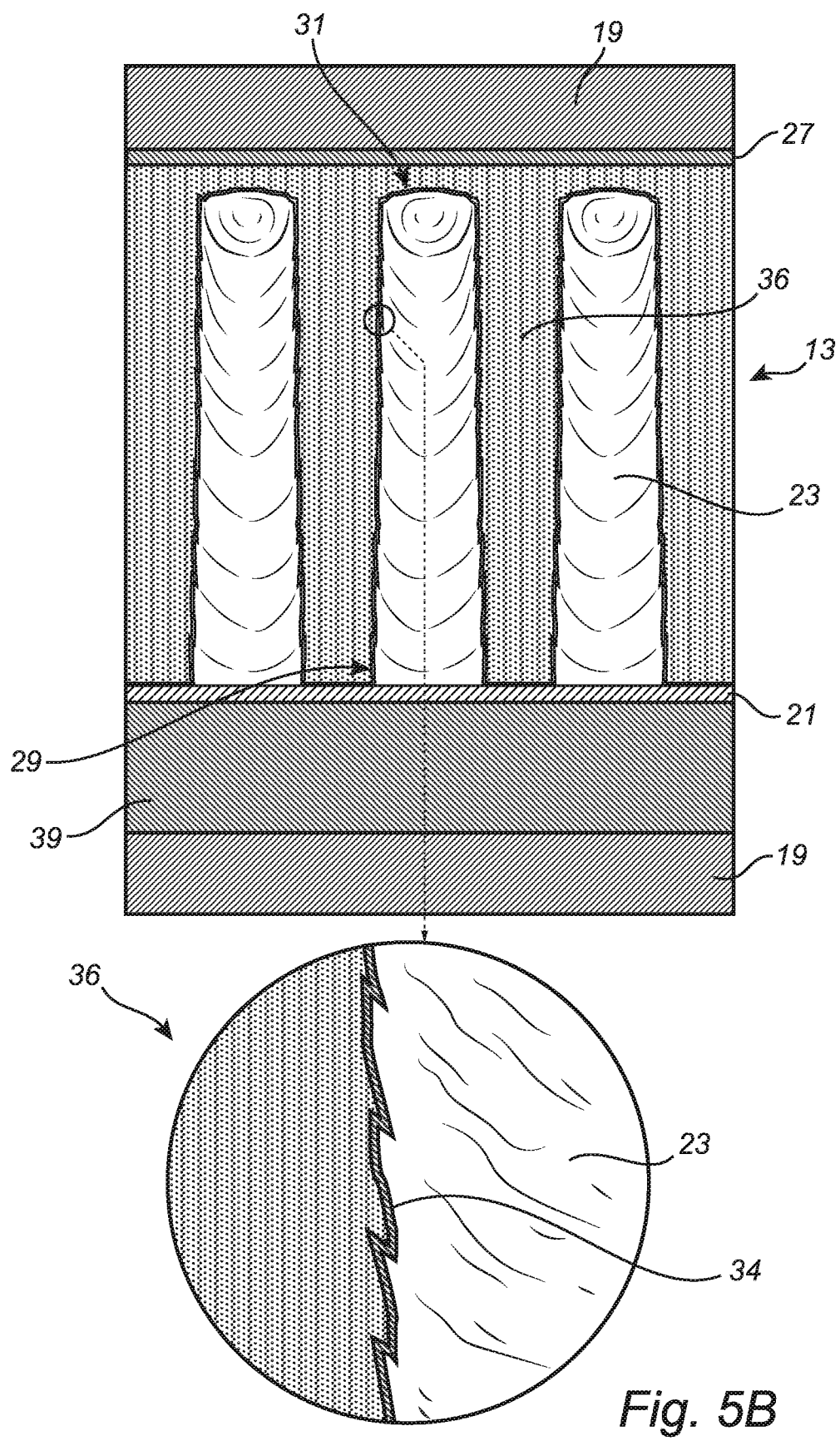
FIG. 5B is an enlarged illustration of a second example MIM-arrangement for a MIM-battery component.

A second example configuration of the MIM-arrangement 13 will now be described with reference to FIG. 5B. A MIM-energy storage component comprising the MIM-arrangement 13 in FIG. 5B is a MIM-electrochemical energy storage/battery component. As is schematically shown in FIG. 5B, the MIM-arrangement 13 comprises a first electrode layer 21, a plurality of conductive nanostructures 23 vertically grown from the first electrode layer 21, an optional anode/cathode material layer 34 coating each nanostructure 23 in the plurality of conductive nanostructures and the first electrode layer 21 not covered by the conductive nanostructures 23, an electrolyte 36 covering the nanostructures 23, and a second electrode layer 27 covering the electrolyte 36. In the example embodiment of FIG. 5B, the electrolyte 36 completely fills a space between adjacent nanostructures more than halfway between a base 29 and a top 31 of the nanostructures 23. In the exemplary MIM-arrangement 13 in FIG. 5B, the electrolyte 36 completely fills the space between adjacent nanostructures 23, all the way from the base 29 to the top 31, and beyond. In embodiments, it may however be beneficial to provide the electrolyte 36 as a conformal coating on the nanostructures 23.

Moreover, additional sub layer(s) for example as metal diffusion barrier not shown in the figure may conveniently be present in accordance with the present invention disclosure.

A hybrid-component may include a MIM-arrangement 13 that is a combination of the MIM-arrangements in FIG. 5A and FIG. 5B. For instance, the dielectric layer 25 in FIG. 5A may be provided between the nanostructures 23 and the electrolyte 36 in FIG. 5B. Such a hybrid-component may further comprise an additional dielectric layer between the electrolyte 36 and the top electrode 27 in FIG. 5B.

Figure 6:
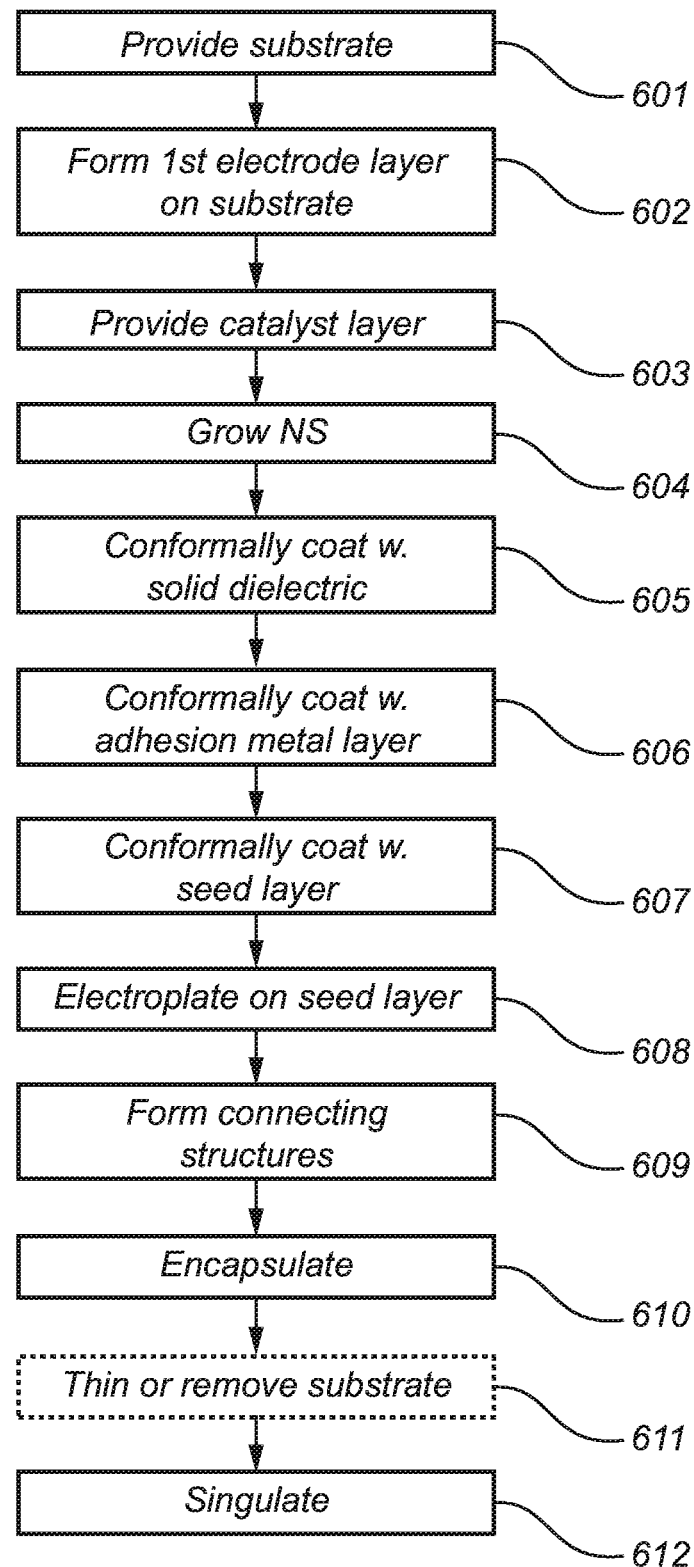
FIG. 6 is a flow-chart illustrating an example embodiment of the manufacturing method according to the present invention.

An example method according to an embodiment of the present invention of manufacturing a discrete MIM-capacitor component, including the exemplary MIM-arrangement 13 in FIG. 5A, will now be described with reference to the flow-chart in FIG. 6. It should be understood that similar steps may be used for forming the MIM-arrangement 13 in FIG. 5B.

In a first step 601, there is provided a substrate 39 (see FIG. 5A). Various substrates may be used, for example, silicon, glass, stainless steel, ceramic, SiC, or any other suitable substrate materials found in the industry. The substrate can however be high temperature polymer such as polymide. The main function of the substrate is to facilitate the processing of the MIM capacitor according to the present invention disclosure.

In the subsequent step 602, a first electrode layer 21 is formed on the substrate 39. The first electrode layer 21 can be formed via physical vapor deposition (PVD), chemical vapor deposition (CVD), atomic layer deposition (ALD), or any other method used in the industry. In some implementations, the first electrode layer 21 may comprise one or more metals selected from: Cu, Ti, W, Mo, Co, Pt, Al, Au, Pd, Ni, Fe and silicide. In some implementations, the first electrode layer 21 may comprise one or more conducting alloys selected from: TiC, TiN, WN, and AlN. In some implementations, the first metal layer 21 may comprise one or more conducting polymers. In some implementations, the first electrode layer 21 may be metal oxide e.g. LiCoO2, doped silicon. In some implementations, the first metal layer 21 may be the substrate itself e.g. Al/Cu/Ag foil etc.

In the next step 603, a catalyst layer is provided on the first electrode layer 21. The catalyst can, for example, be nickel, iron, platinum, palladium, nickel-silicide, cobalt, molybdenum, Au or alloys thereof, or can be combined with other materials (e.g., silicon). The catalyst can be optional, as the technology described herein can also be applied in a catalyst-free growth process for nanostructures. Catalyst can also be deposited through spin coating of catalyst particles.

In some implementations, a layer of catalyst is used to grow the nanostructures as well as to be used as connecting electrodes. In such implementations, the catalyst can be a thick layer of nickel, iron, platinum, palladium, nickel-silicide, cobalt, molybdenum, Au or alloys thereof, or can be combined with other materials from periodic table. The catalyst layer (not shown in FIG. 5A), may be provided as a uniform layer or as a patterned layer. The formation of a patterned layer of course requires more processing than an unpatterned layer, but may provide for a higher or lower, and a more regular density of nanostructures 23, which may in turn provide for a higher capacitance of the finished MIM-capacitor components 11 or more control over the absolute capacitance values per capacitor device if more than one capacitor is embedded in capacitor component 11.

Nanostructures 23 are grown from the catalyst layer in step 604. As was explained in the Summary section above, the present inventors have found that vertically grown carbon nanofibers (CNF) may be particularly suitable for MIM-capacitor components 11. The use of vertically grown nanostructures allows extensive tailoring of the properties of the nanostructures. For instance, the growth conditions may be selected to achieve a morphology giving a large surface area of each nanostructure, which may in turn increase the charge storing capacitance or capacitance per 2D footprint. As an alternative to CNF, the nanostructures may be metallic carbon nanotubes or carbide-derived carbon nanostructures, nanowires such as copper, aluminum, silver, silicide or other types of nanowires with conductive properties. Advantageously, the catalyst material, and growth gases etc may be selected in, per se, known ways to achieve so-called tip growth of the nanostructures 23, which may result in catalyst layer material at the tips 31 of the nanostructures 23.

Following the growth of the vertically aligned conductive nanostructures 23, the nanostructures 23 and the first electrode layer 21 may optionally conformally coated by a metal layer, primarily for improved adhesion between the nanostructures 23 and the conduction controlling material.

Following the growth of the vertically aligned conductive nanostructures 23, the nanostructures 23, and the portions of the first electrode layer 21 left uncovered by the nanostructures 23, are conformally coated by a layer 25 of a solid dielectric material in step 605. The solid dielectric material layer 25 may advantageously be made of a so-called high-k dielectric. The high k-dielectric materials may e.g. be HfOx, TiOx, TaOx or other well-known high k dielectrics. Alternatively, the dielectric can be polymer based e.g. polypropylene, polystyrene, poly(p-xylylene), parylene etc. Other well-known dielectric materials, such as SiOx or SiNx, etc may also be used as the dielectric layer. Any other suitable conduction controlling materials may appropriately be used. The dielectric materials may be deposited via CVD, thermal processes, atomic layer deposition (ALD) or spin coating or spray coating or any other suitable method used in the industry. In various embodiments it may be advantageous to use more than one dielectric layer or dissimilar dielectric materials with different dielectric constant or different thicknesses of dielectric materials to control the effective dielectric constant or influence the breakdown voltage or the combination of them to control the dielectric film properties. Advantageously, the solid dielectric material layer 25 is coated uniformly with atomic uniformity over the nanostructures 23 such that the dielectric layer covers the entirety of the nanostructures 23 so that the leakage current of the capacitor device is minimized. Another advantage of providing the solid dielectric layer 25 with atomic uniformity is that the solid dielectric layer 25 can conform to the extremely small surface irregularities of the conductive nanostructures 23, which may be introduced during growth of the nanostructures. This provides for an increased total electrode surface area of the MIM-arrangement 13, which in turn provides for a higher capacitance for a given component size. A step of conformally coating a metal layer on the nanostructures may optionally be introduced between step 604 and 605 to, for example, facilitate adhesion of the dielectric layer 25 or, where applicable, an electrolyte layer to the nanostructures 23.

In the next step 606, an adhesion metal layer—the above-mentioned first sub-layer 33 of the second electrode layer 27—is conformally coated on the solid dielectric material layer 25. The adhesion metal layer 33 may advantageously be formed using ALD, and an example of a suitable material for the adhesion metal layer 33 may be Ti, or TiN.

On top of the adhesion metal layer 33, a so-called seed metal layer 37—the above-mentioned third sub-layer 37 of the second electrode layer 27—may optionally be formed in step 607. The seed metal layer 37 may be conformally coated on the adhesion metal layer 33. The seed metal layer 37 may, for example, be made of Al, Cu or any other suitable seed metal materials.

Following formation of the seed metal layer 37, the above-mentioned second sub-layer 35 is provided in step 608. This second sub-layer 35 of the second electrode layer 21 may, for example, be formed via chemical method such as electroplating, electroless plating or any other method known in the art. As is schematically indicated in FIG. 5, the second sub-layer 35 may advantageously fill the spaces between the nanostructures 23 to provide for improved structural robustness etc.

The first 15 and second 17 connecting structures, such as bumps, balls or pillars, are formed in step 609, using, per se, known techniques.

In the subsequent step 610, insulating encapsulation material 19 is provided to at least partly embed the MIM-arrangement 13. Any known suitable encapsulant material can be used for the encapsulant layer, for example, silicone, epoxy, polyimide, BCB, resins, silica gel, epoxy underfill etc. In some aspect, silicone materials can be favorable if it fits with certain other IC packaging schemes. Encapsulant may be cured to form the encapsulation layer. In some aspect of the present invention, the encapsulant layer maybe a curable material so that the passive component can be attached through curing process. In some aspect, the dielectric constant of the encapsulant is different than the dielectric constant of the dielectric materials used in the MIM construction. In some aspects, lower dielectric constant of the encapsulant materials is preferred compared with the dielectric materials used in manufacturing the MIM capacitor. In some aspect, SiN, SiO or spin on glass can also be used as a encapsulant materials. The encapsulant layer can be spin coated and dried, deposited by CVD, or by any other method known in the art.

After this step, the substrate 39 may optionally be thinned down or completely removed, in optional step 611, depending on the desired configuration of the finished MIM-capacitor component.

For the case where the substrate is the first electrode, this step is optional unless further thinning is necessary.

In the following step 612, the panels or wafers are singulated using known techniques to provide the discrete MIM-capacitor components 11.

Any of the previously described embodiments are suitable to be fabricated at a wafer level processes and panel level processes used in the industry. They may conveniently be referred to as wafer level processing and panel level processing respectively. In wafer level processing typically, a circular shaped substrate is used, size ranging from 2 inch to 12-inch wafers. In the panel level processing, the size is defined by the machine capacity and can be circular or rectangular or square ranging larger sizes typically but not limited to 12 to 100 inches. Panel level processing is typically used in producing smart televisions. Hence the size can be as the size of a television or larger. In an aspect for wafer level processes, at least one of the embodiments described above is processed at a wafer level in a semiconductor processing foundry. In another aspect, for panel level processes, at least one of the embodiments described above is processed using panel level processing. Depending on the design requirements, after processing, the wafer or panel is cut into smaller pieces utilizing standard dicing, plasma dicing or laser cutting. Such singulation process step can be configured through dicing or plasma dicing or laser cutting to tailor the shape and size of the discrete component formed according to the need.

The present invention is also contemplated to be compatible to be used in the roll to roll manufacturing technology. Roll to roll processing is a method of producing flexible and large-area electronic devices on a roll of plastic or metal foil. The method is also described as printing method. Substrate materials used in roll to roll printing are typically paper, plastic films or metal foils or stainless steel. The roll to roll method enables a much higher throughput than other methods like wafer level or panel levels and have much smaller carbon footprint and utilize less energy. Roll to roll processing is applied in numerous manufacturing fields such as flexible and large-area electronics devices, flexible solar panels, printed/flexible thin-film batteries, fibers and textiles, metal foil and sheet manufacturing, medical products, energy products in buildings, membranes and nanotechnology.

Figure 7:
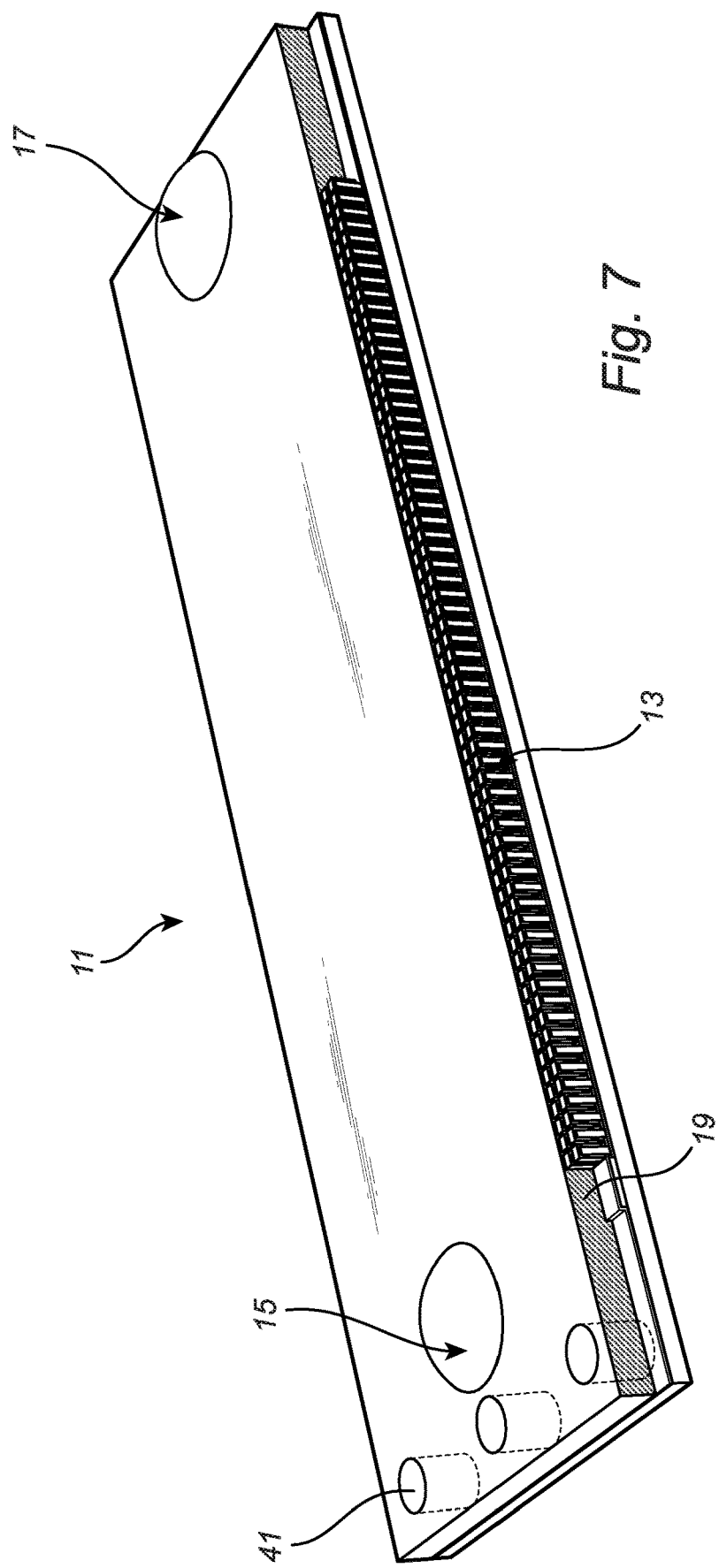
FIG. 7 is a schematic illustration of a MIM-energy storage component according to a second example embodiment of the present invention.

FIG. 7 is a schematic illustration of a MIM-energy storage component 11 according to a second example embodiment of the present invention. The MIM-energy storage component 11 in FIG. 7 differs from that described above with reference to FIG. 4 in that conducting vias 41 are provided to facilitate component stacking.

Figure 8:
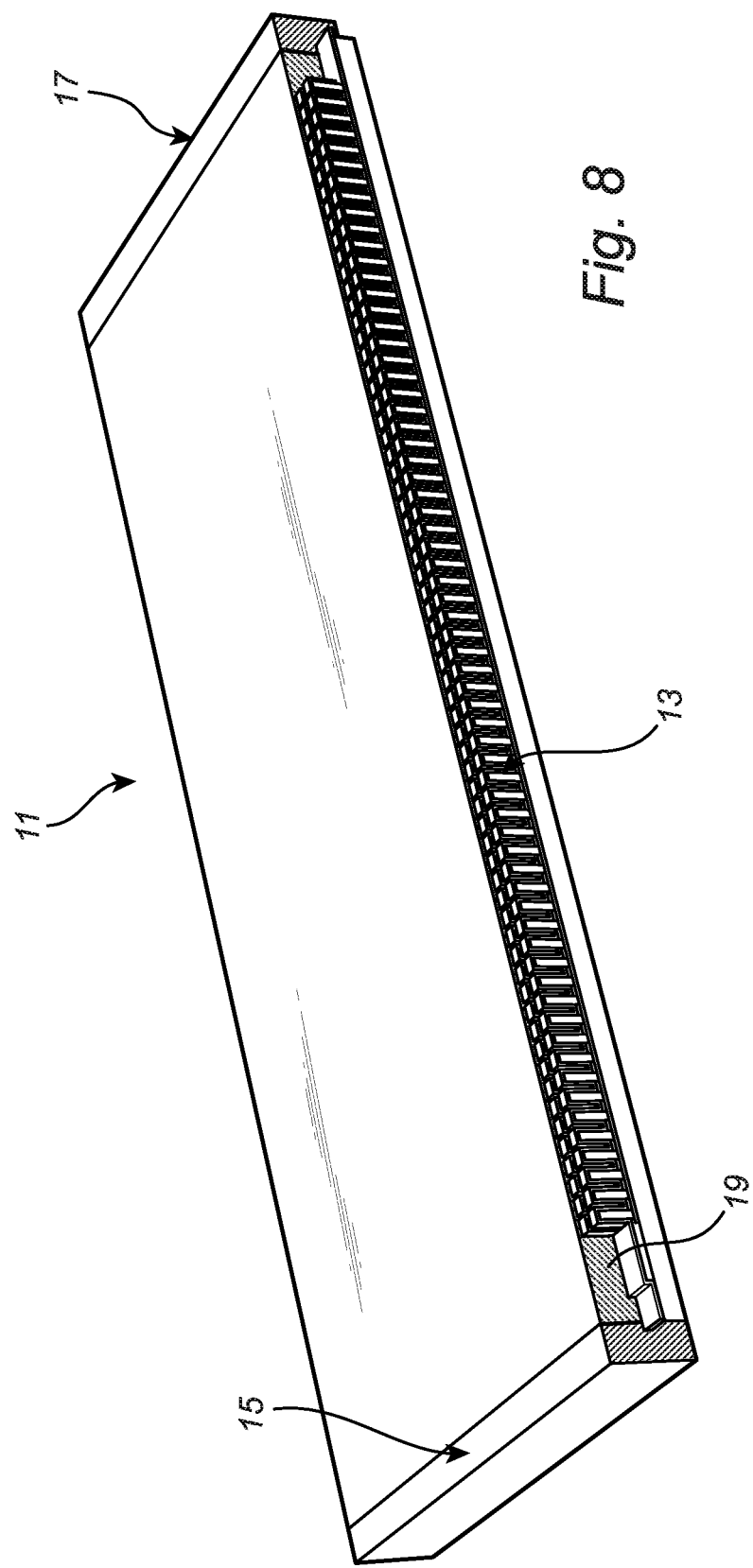
FIG. 8 is a schematic illustration of a MIM-energy storage component according to a third example embodiment of the present invention.

FIG. 8 is a schematic illustration of a MIM-energy storage component 11 according to a third example embodiment of the present invention. The MIM-energy storage component 11 in FIG. 8 differs from that described above with reference to FIG. 4 in that the first 15 and second 17 connecting structures are provided as end contacts on opposing side surfaces of the MIM-energy storage component 11. In FIG. 8, the first 15 and second 17 connecting structures are illustrated as being arranged on the short sides of the rectangular component 11. In embodiments, the first 15 and second 17 connecting structures may instead be arranged on the long sides of the component. Such a configuration may provide for a reduced series inductance of the component.

Figure 9:
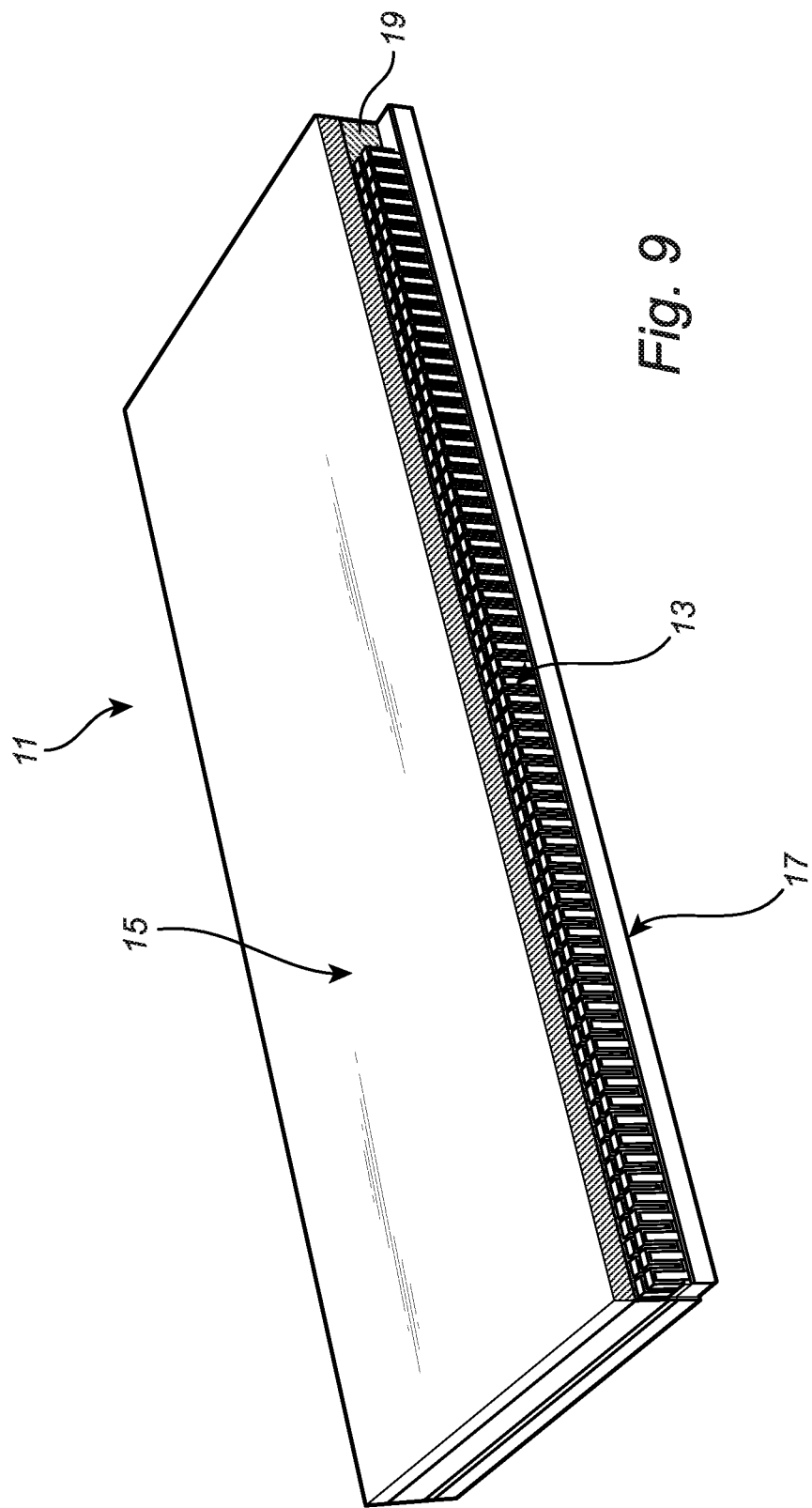
FIG. 9 is a schematic illustration of a MIM-energy storage component according to a fourth example embodiment of the present invention.

FIG. 9 is a schematic illustration of a MIM-energy storage component 11 according to a fourth example embodiment of the present invention. The MIM-energy storage component 11 in FIG. 9 differs from that described above with reference to FIG. 4 in that the first 15 and second 17 connecting structures are provided as top and bottom surfaces of the MIM-energy storage component 11. In this example embodiment, the substrate used in the above-described manufacturing of the MIM-arrangement 13 has been completely or partly removed after formation of the first 15 and second 17 connecting structures.

Figure 10:
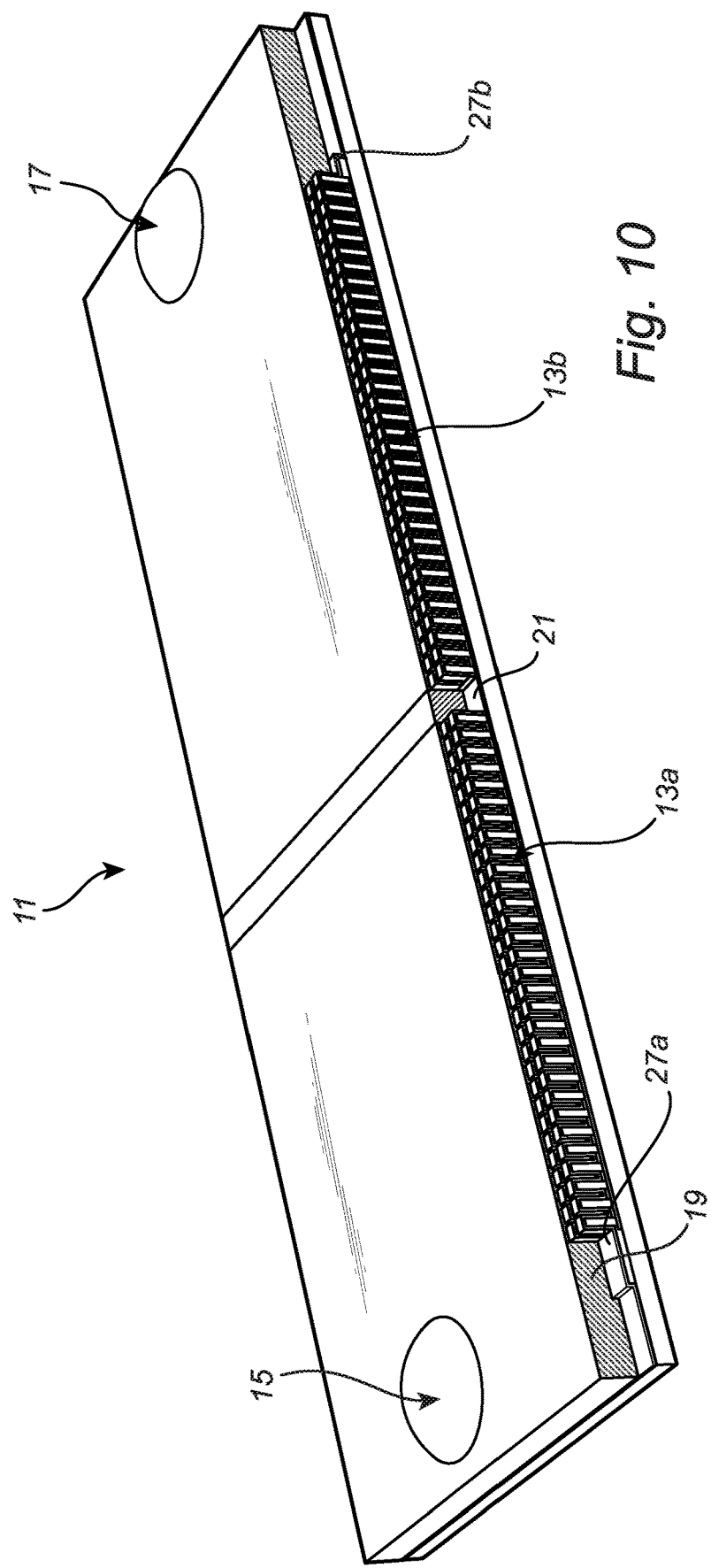
FIG. 10 is a schematic illustration of a MIM-energy storage component according to a fifth example embodiment of the present invention.

FIG. 10 is a schematic illustration of a MIM-energy storage component 11 according to a fifth example embodiment of the present invention. The MIM-energy storage component 11 in FIG. 10 comprises a first 13a and a second 13b MIM-arrangement. As is indicated in FIG. 10, the second electrode 27a of the first MIM-arrangement 13a is connected to the first connecting structure 15, and the second electrode 27b of the second MIM-arrangement 13b is connected to the second connecting structure 17. The first electrode 21 is common to the first 13a and the second 13b MIM-arrangements. The resulting MIM-energy storage component 11 thus comprises two energy storages connected in series. This means that the total voltage across the MIM-energy storage component 11—between the first connecting structure 15 and the second connecting structure 17—is distributed between the first energy storage (first MIM-arrangement 13a) and the second energy storage (second MIM-arrangement 13b). Hereby, a higher operating voltage of the component may be provided for, and the breakdown voltage may be increased.

Figure 11:
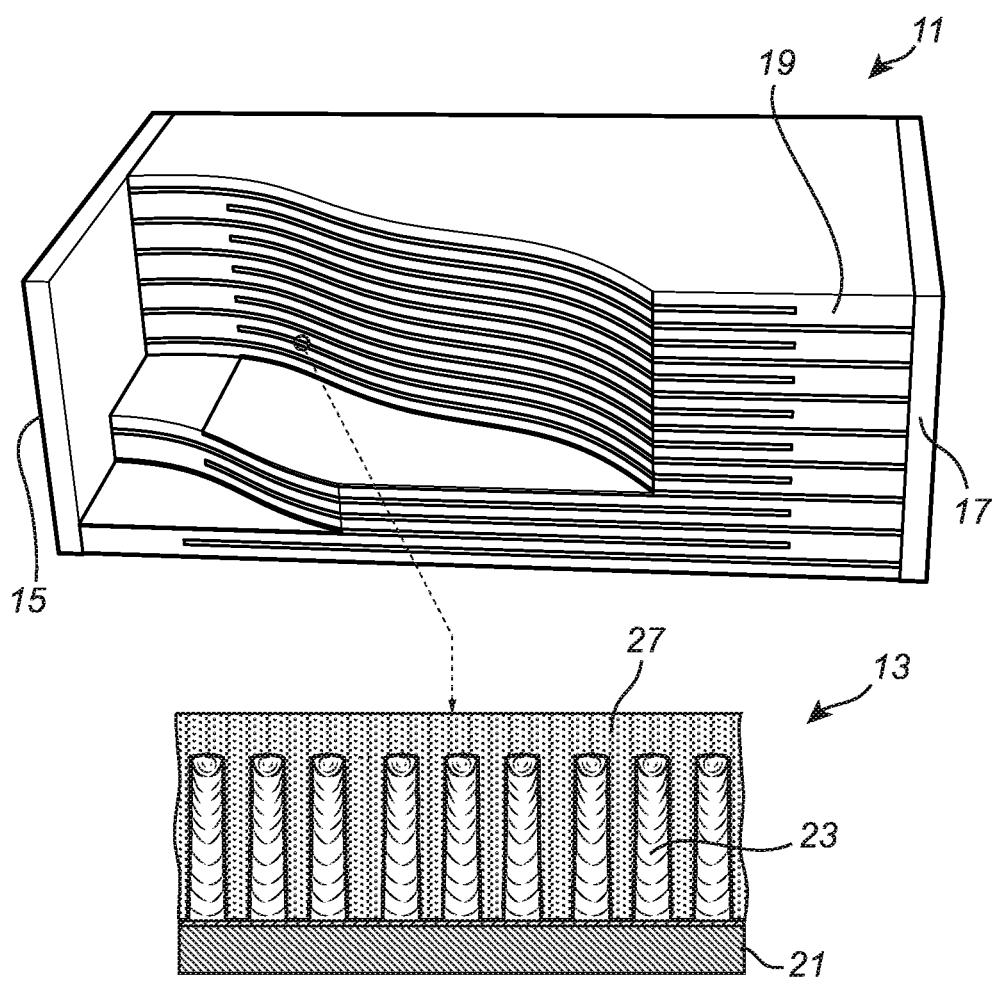
FIG. 11 is a schematic illustration of a MIM-energy storage component according to a sixth example embodiment of the present invention.

FIG. 11 is a schematic illustration of a MIM-energy storage component according to a sixth example embodiment of the present invention, in the form of a multi-layer MIM-energy storage component 11. The energy storage component 11 in FIG. 11 is conceptually similar to an MLCC-component, but instead of a layer of dielectric material, a MIM-arrangement similar to the MIM-energy storage component described above in connection with FIG. 9 is provided between electrodes connected to the first 15 and second 17 connecting structures, respectively. The MIM-energy storage component 11 in FIG. 11 may exhibit a package height similar to a conventional MLCC-component, but with a much higher capacitance.

Figure 12:
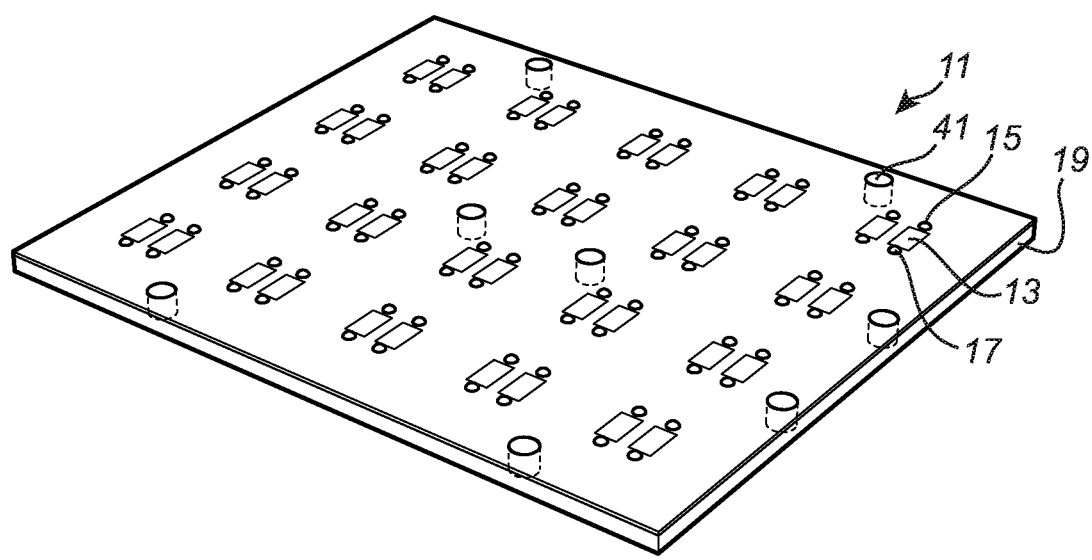
FIG. 12 is a schematic illustration of a MIM-energy storage component according to a seventh example embodiment of the present invention.

FIG. 12 is a schematic illustration of a MIM-energy storage component according to a seventh example embodiment of the present invention. This MIM-energy storage component 11 comprises a plurality of MIM-energy storages, as well as vias 41. The different MIM-energy storages may, if desired, be tuned to different energy storage capacity values. The MIM-energy storage component 11 in FIG. 12 may be a beneficial alternative to a large number of discrete energy storage components, in some applications.

The person skilled in the art realizes that the present invention by no means is limited to the preferred embodiments described above. On the contrary, many modifications and variations are possible within the scope of the appended claims.

In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measures cannot be used to advantage. Any reference signs in the claims should not be construed as limiting the scope.

The invention claimed is:

1. A discrete metal-insulator-metal (MIM) energy storage component, comprising:
   a substrate having a first side and a second side opposite the first side;
   a MIM-arrangement on the first side of the substrate, the MIM-arrangement comprising:
   a first electrode layer deposited on the first side of the substrate;
   a plurality of conductive nanostructures grown from said first electrode layer;
   a conduction controlling material covering each conductive nanostructure in said plurality of conductive nanostructures and said first electrode layer left uncovered by said conductive nanostructures; and
   a second electrode layer covering said conduction controlling material;
   a first connecting structure for external electrical connection of said discrete MIM energy storage component;
   a second connecting structure for external electrical connection of said discrete MIM energy storage component; and
   an electrically insulating encapsulation material at least partly embedding said MIM-arrangement, in such a way that the electrically insulating encapsulation material at least partly forms an outer boundary surface of the discrete MIM energy storage component;
   wherein the second side of the substrate at least partly forms the outer boundary surface of the discrete MIM energy storage component.

2. The discrete MIM energy storage component according to claim 1, wherein the conduction controlling material is conformally coating each conductive nanostructure in said plurality of conductive nanostructures and said first electrode layer left uncovered by said conductive nanostructures.

3. The discrete MIM energy storage component according to claim 1, wherein the electrically insulating encapsulation material leaves the first connecting structure and the second connecting structure uncovered by the encapsulation material.

4. The discrete MIM energy storage component according to claim 1, wherein each of the first connecting structure and the second connecting structure at least partly forms an outer boundary surface of the discrete MIM energy storage component.

5. The discrete MIM energy storage component according to claim 1, wherein said second electrode layer completely fills a space between adjacent conductive nanostructures in said plurality of conductive nanostructures, at least halfway between a base and a top of the conductive nanostructures.

6. The discrete MIM energy storage component according to claim 5, wherein said second electrode layer completely fills the space between adjacent conductive nanostructures in said plurality of conductive nanostructures, all the way between the base and the top of the conductive nanostructures.

7. The discrete MIM energy storage component according to claim 1, wherein said second electrode layer comprises:
   a first sub-layer conformally coating said conduction controlling material; and
   a second sub-layer formed on said first sub-layer.

8. The discrete MIM energy storage component according to claim 7, wherein said second electrode layer comprises a third sub-layer between said first sub-layer and said second sub-layer, said third sub-layer conformally coating said first sub-layer.

9. The discrete MIM energy storage component according to claim 1, wherein said conductive nanostructures are carbon nanofibers (CNF).

10. The discrete MIM energy storage component according to claim 9, wherein said carbon nanofibers are at least partly formed by amorphous carbon.

11. The discrete MIM energy storage component according to claim 9, wherein said carbon nanofibers have a corrugated surface structure and/or are branched nanofibers.

12. The discrete MIM energy storage component according to claim 1, wherein said MIM-arrangement further comprises a catalyst layer between said first electrode layer and the conductive nanostructures in said plurality of conductive nanostructures.

13. The discrete MIM energy storage component according to claim 12, wherein said catalyst layer is a pre-patterned catalyst layer.

14. The discrete MIM energy storage component according to claim 13, wherein said catalyst layer is pre-patterned in a periodic configuration.

15. The discrete MIM energy storage component according to claim 12, wherein each conductive nanostructure in the plurality of conductive nanostructures comprised in said MIM-arrangement includes catalyst material at a tip of said conductive nanostructure.

16. The discrete MIM energy storage component according to claim 1, wherein a surface density of the conductive nanostructures in the plurality of conductive nanostructures comprised in said MIM-arrangement is at least 1000 per $mm^2$.

17. The discrete MIM energy storage component according to claim 1, wherein:
   said discrete MIM energy storage component has as top surface, a bottom surface, and a side surface connecting said top surface and said bottom surface;
   said first connecting structure constitutes a first portion of the top surface; and
   said second connecting structure constitutes a second portion of the top surface.

18. The discrete MIM energy storage component according to claim 17, wherein said discrete MIM energy storage component further comprises at least one via extending from said bottom surface to said top surface.

19. The discrete MIM energy storage component according to claim 1, wherein:
said discrete MIM energy storage component has as top surface, a bottom surface, and a side surface connecting said top surface and said bottom surface;
said first connecting structure constitutes a portion of the top surface; and
said second connecting structure constitutes a portion of the bottom surface.

20. The discrete MIM energy storage component according to claim 1, wherein:
said discrete MIM energy storage component has as top surface, a bottom surface, and a side surface connecting said top surface and said bottom surface;
said first connecting structure constitutes a portion of the side surface; and
said second connecting structure constitutes a portion of the side surface.

21. The discrete MIM energy storage component according to claim 1, wherein:
said first connecting structure is electrically conductively connected to the first electrode layer of said MIM-arrangement; and
said second connecting structure is electrically conductively connected to the second electrode layer of said MIM-arrangement.

22. The discrete MIM energy storage component according to claim 1, comprising at least a first MIM-arrangement and a second MIM-arrangement, each of the at least first and second MIM-arrangements comprising:
a first electrode layer;
a plurality of conductive nanostructures vertically grown from said first electrode layer;
a conduction controlling material covering each conductive nanostructure in said plurality of conductive nanostructures and said first electrode layer uncovered by said conductive nanostructures; and
a second electrode layer covering said conduction controlling material.

23. The discrete MIM energy storage component according to claim 22, wherein:
said first connecting structure is connected to one of the first electrode layer and the second electrode layer of said first MIM-arrangement;
the other one of the first electrode layer and the second electrode layer of said first MIM-arrangement is connected to one of the first electrode layer and the second electrode layer of said second MIM-arrangement; and
said second connecting structure is connected to the other one of the first electrode layer and the second electrode layer of said second MIM-arrangement.

24. The discrete MIM energy storage component according to claim 23, wherein said first MIM-arrangement and said second MIM-arrangement are arranged in a layered configuration.

25. The discrete MIM energy storage component according to claim 22, wherein:
said first connecting structure is connected to the first electrode layer of said first MIM-arrangement and to one of the first electrode layer and the second electrode layer of said second MIM-arrangement; and
said second connecting structure is connected to the second electrode layer of said first MIM-arrangement and to the other one of the first electrode layer and the second electrode layer of said second MIM-arrangement.

26. The discrete MIM energy storage component according to claim 1, wherein the conduction controlling material is a solid dielectric, and the discrete MIM energy storage component is a nanostructure capacitor component.

27. The discrete MIM energy storage component according to claim 1, wherein the conduction controlling material is an electrolyte, and the discrete MIM energy storage component is a nanostructure battery component.

28. The discrete MIM energy storage component according to claim 1, wherein the conduction controlling material comprises a solid dielectric and an electrolyte in a layered configuration.

29. An electronic device comprising:
a printed circuit board (PCB);
an integrated circuit (IC) on the PCB; and
the discrete MIM energy storage component according to claim 1 connected to the IC.

30. A discrete metal-insulator-metal (MIM) energy storage component, comprising:
a substrate having a first side and a second side opposite the first side;
at least a first and a second MIM-arrangement on a first side of the substrate, each comprising:
a first electrode layer;
a plurality of conductive nanostructures vertically grown from said first electrode layer;
a conduction controlling material covering each conductive nanostructure in said plurality of conductive nanostructures and said first electrode layer uncovered by said conductive nanostructures; and
a second electrode layer covering said conduction controlling material;
a first connecting structure for external electrical connection of said discrete MIM energy storage component, said first connecting structure being electrically conductively connected to the first electrode layer of said first MIM-arrangement;
a second connecting structure for external electrical connection of said discrete MIM energy storage component, said second connecting structure being electrically conductively connected to the second electrode layer of said first MIM-arrangement;
a third connecting structure for external electrical connection of said discrete MIM energy storage component, said third connecting structure being electrically conductively connected to the first electrode layer of said second MIM-arrangement;
a fourth connecting structure for external electrical connection of said discrete MIM energy storage component, said fourth connecting structure being electrically conductively connected to the second electrode layer of said second MIM-arrangement; and
an electrically insulating encapsulation material at least partly embedding said at least first and second MIM-arrangements, in such a way that the electrically insulating encapsulation material at least partly forms an outer boundary surface of the discrete MIM energy storage component;
wherein the second side of the substrate at least partly forms the outer boundary surface of the discrete MIM energy storage component.

31. An electronic device comprising:
a printed circuit board (PCB);
an integrated circuit (IC) on the PCB; and the discrete MIM energy storage component according to claim 30 connected to the IC.

\* \* \* \* \*